(12) United States Patent
Hurwitz et al.

(10) Patent No.: US 10,461,724 B2
(45) Date of Patent: Oct. 29, 2019

(54) RELAXATION OSCILLATOR WITH OVERSHOOT ERROR INTEGRATION

(71) Applicant: Analog Devices Global, Hamilton (BM)

(72) Inventors: Jonathan Ephraim David Hurwitz, Edinburgh (GB); Sean B. Brennan, Adare (IE)

(73) Assignee: Analog Devices Global, Hamilton (BM)

(*) Notice: Subject to any disclaimer, the term of this patent is extended or adjusted under 35 U.S.C. 154(b) by 173 days.

(21) Appl. No.: 15/358,782

(22) Filed: Nov. 22, 2016

(65) Prior Publication Data

US 2018/0145665 A1     May 24, 2018

(51) Int. Cl.
   *H03K 4/502*          (2006.01)
   *H03L 7/099*          (2006.01)
   (Continued)

(52) U.S. Cl.
   CPC ............... *H03K 4/502* (2013.01); *H03B 1/00* (2013.01); *H03B 5/20* (2013.01); *H03K 3/0231* (2013.01);
   (Continued)

(58) Field of Classification Search
   CPC ...... H03B 5/1221; H03B 5/1228; H03B 5/24; H03B 5/26; H03B 2200/0082; H03B 1/00;
   (Continued)

(56) References Cited

U.S. PATENT DOCUMENTS

| 6,853,258 B2 | 2/2005 | Toliver et al. |
| 7,332,979 B2 | 2/2008 | Connell et al. |

(Continued)

OTHER PUBLICATIONS

Cao, Ying, et al., "A 63,000 Q-Factor Relaxation Oscillator with Switched Capacitor Integrated Error Feedback", (2013), 14 pgs.

(Continued)

*Primary Examiner* — Arnold M Kinkead
(74) *Attorney, Agent, or Firm* — Schwegman Lundberg & Woessner, P.A.

(57) ABSTRACT

A relaxation oscillator can provide a smaller and cheaper alternative to a crystal oscillator circuit in a wide variety of applications. A sawtooth relaxation oscillator can include overshoot error integration. Separate and distinct oscillator capacitor charging, overshoot error integration, and reset phases can be provided using separate comparators for first and second oscillation capacitors. Potential advantages can include high accuracy high-frequency clock, convenient trimming during initial calibration, clock frequency stability over temperature and time, fast startup with low overshoot, high power supply rejection, low power, or low noise/jitter. The oscillator can charge an oscillation capacitor up to a target voltage, then interrupt charging before beginning an error integration phase that adjusts the target voltage by integrating an overshoot error of a voltage on the oscillation capacitor. After completing the overshoot error integration, the voltage on the oscillation capacitor can be reset. The techniques described are believed to be capable of improving clock frequency accuracy and other characteristics.

24 Claims, 10 Drawing Sheets

(51) Int. Cl.
*H03K 3/03* (2006.01)
*H03B 1/00* (2006.01)
*H03K 3/0231* (2006.01)
*H03B 5/20* (2006.01)

(52) U.S. Cl.
CPC ......... *H03K 3/0315* (2013.01); *H03L 7/0995* (2013.01); *H03B 2200/0082* (2013.01)

(58) Field of Classification Search
CPC ........ H03B 5/20; H03K 3/011; H03K 3/0231; H03K 3/0315; H03K 3/02315; H03K 4/501; H03K 5/135; H03K 2005/00065; H03K 3/023; H03K 5/00006; H03K 5/13; H03K 5/131; H03K 5/1565; H03K 4/502; H03L 7/00
USPC ............................................ 331/111, 143, 34
See application file for complete search history.

(56) References Cited

U.S. PATENT DOCUMENTS

| | | |
|---|---|---|
| 8,212,624 B2 | 7/2012 | Tokunaga et al. |
| 2013/0181760 A1 | 7/2013 | Lin |
| 2014/0062596 A1 | 3/2014 | Glibbery |
| 2018/0091096 A1* | 3/2018 | Wu .......................... H03B 5/24 |

OTHER PUBLICATIONS

Tokunaga, Y., et al., "An On-Chip CMOS Relaxation Oscillator With Voltage Averaging Feedback", IEEE Journal of Solid-State Circuits, 45(6), (Jun. 2010).

* cited by examiner

RELAXATION OSCILLATOR WITH OVERSHOOT ERROR INTEGRATION

TECHNICAL FIELD

This document pertains generally, but not by way of limitation, to integrated circuits, and more particularly, to a relaxation oscillator with overshoot error integration.

BACKGROUND

An oscillator circuit can be used for on-chip clock generation to generate a frequency-stable clock signal, which can then be divided and provided to other synchronous circuits that can provide an embedded function. A crystal oscillator circuit can be used to provide a high accuracy clock signal, but can require external pins and can be bulky and expensive. A smaller and less expensive RC relaxation oscillator can use a resistor and a capacitor to achieve a time constant to establish the clock frequency, but typically with less accuracy than a crystal oscillator.

SUMMARY

The present inventors have recognized, among other things a need to provide an accurate and stable high frequency clock signal using a relaxation oscillator, such as can provide a smaller and cheaper alternative to a crystal oscillator circuit in a wide variety of applications. This document describes, among other things a sawtooth (or other) relaxation oscillator with overshoot error integration, such as can potentially provide one or more advantages, such as high accuracy high-frequency clock, convenient trimming during initial calibration (e.g., at factory or upon power-up), clock frequency stability over temperature and time, fast startup with low overshoot, high power supply rejection, low power, or low noise/jitter. The oscillator can charge an oscillation capacitor up to a target voltage, then interrupt charging before beginning an error integration phase that adjusts the target voltage by integrating an overshoot error of a voltage on the oscillation capacitor. After completing the overshoot error integration, the voltage on the oscillation capacitor can be reset. The device and techniques described are believed to be capable of improving clock frequency accuracy by an order of magnitude relative to such a device or technique without such overshoot error integration, while allowing initial trimming at a single temperature, and providing fast startup time.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document describes, among other things a sawtooth relaxation oscillator with overshoot error integration, such as can potentially provide one or more advantages, such as high accuracy high-frequency clock, convenient trimming during initial calibration, clock frequency stability over temperature and time, fast startup with low overshoot, high power supply rejection, low power, or low noise/jitter. The oscillator can charge an oscillation capacitor up to a target voltage, then interrupt charging before beginning an error integration phase that adjusts the target voltage by integrating an overshoot error of a voltage on the oscillation capacitor. After completing the overshoot error integration, the voltage on the oscillation capacitor can be reset. The device and techniques described are believed to be capable of improving clock frequency accuracy by an order of magnitude relative to such a device or technique without such overshoot error integration, while allowing initial trimming at a single temperature, and providing fast startup time.

In a resistor-capacitor (RC) oscillator circuit, the oscillator output clock frequency of the oscillator ($F_{osc}$) is determined by the resistance value of the oscillation resistor ($R_{osc}$) and the capacitance value of oscillation capacitor ($C_{osc}$). However, the oscillator output clock frequency can also be affected by an offset of a comparator circuit that can be used to set a target value to which the oscillation capacitor is charged. The oscillator output clock frequency can also be affected by propagation delays ("$T_{prop}$") of the comparator and a logic circuit operating the oscillation capacitor charging or discharging switches under control of the comparator circuit.

Figure 1:
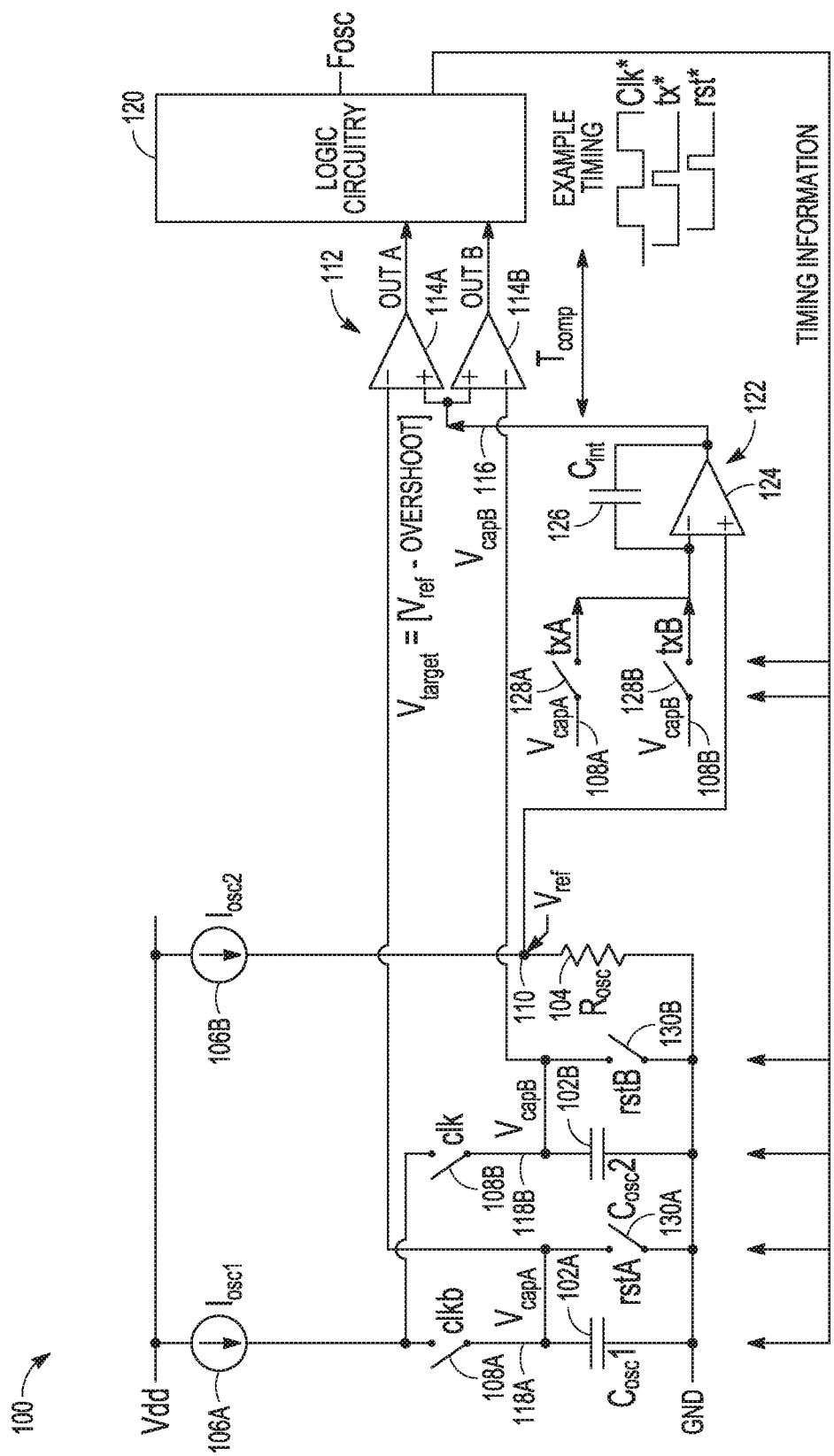
FIG. 1 shows an example of an overshoot error integrating sawtooth relaxation oscillator circuit.

FIG. 1 shows an example of an overshoot error integrating sawtooth relaxation oscillator circuit 100. In this example, a first oscillation capacitor $C_{osc}$ 102A and a second oscillation capacitor $C_{osc}$ 102B can include like nominal capacitance values that together with the resistance value of the oscillation resistor $R_{osc}$ 104 can be specified or trimmed to establish the oscillator output clock frequency $F_{osc}$. The oscillation capacitors 102A-B can be charged by one or more current sources $I_{osc1}$ 106A, such as via corresponding capacitor charging switches 108A-B during a first charging phase (clkb) such as for charging the first oscillation capacitor 102A and a second charging phase (clk) such as for charging the second oscillation capacitor 102B. The first and second charging phases can be alternatingly staggered and non-overlapping, such as to provide alternating charging of the oscillation capacitors 102A-B by the current sources 106A-B, respectively. A current source $I_{osc2}$ 106B can provide current to the oscillation resistor 104, such as to establish a reference voltage ($V_{ref}$) at node 110. The current used to generate the reference voltage $V_{ref}$ at node 110 can be a like or scaled copy of the current used to charge one or more of the oscillation capacitors 102, or the current used to charge one or more of the oscillation capacitors 102 can be made a function of the reference voltage $V_{ref}$ at node 110. For example, the current sources 106A-B can be matched with each other or scaled with respect to one another, and can be implemented as one or more current mirror replicates of p-type or other field-effect transistors (FETs), with corresponding optional cascode devices, or other variations, and can be configured to source current, such as shown in FIG. 1, or to sink current (not shown), as appropriate to the particular oscillator configuration. The current sources 106A-B can be configured to provide temperature stability, such as by being mirrored from a current source established with a temperature stable bandgap voltage reference ($V_{bg}$) and a reference resistor ($R_{ref}$), such as may be trimmed to a desired reference resistor value during manufacturing. The current sources 106A-B can be configured as proportional-to-absolute-temperature (PTAT) current sources, or can include a combination of temperature stable and temperature-sensitive components such as to achieve a desired temperature dependence, such as to offset or compensate for another temperature dependence in the oscillator circuit 100. Using a current source, which typically has a high output impedance, to provide a current to the oscillation resistor 104 to establish the reference voltage can advantageously provide good power supply noise rejection over an approach that uses a resistor divider to establish the reference voltage by dividing down the power supply voltage. Similarly, using a current source to provide charging to the oscillation capacitors 102A-B can provide better power supply noise rejection over an approach that uses a resistor to charge the oscillation capacitors 102A-B.

The oscillator circuit 100 can include a set-reset (S-R) comparator circuit arrangement 112, such as can include separate first and second comparator circuits 114A-B. The first and second comparator circuits can have their non-inverting inputs connected to a shared target voltage ($V_{target}$) node 116, such as can be provided by the output of an error integrator circuit, such as explained herein. The inverting input of the comparator circuit 114A can be connected to the charging terminal VcapA of the oscillation capacitor 102A at node 118A. The inverting input of the comparator circuit 114B can be connected to the charging terminal VcapB of the oscillation capacitor 102B at node 118B. When the oscillation capacitor 102A has charged to the target voltage at node 116, comparator 114A is triggered, and the logic circuitry 120 interrupts the charging by opening the switch 108A via the signal clkb. Similarly, when the oscillation capacitor 102B has charged to the target voltage at node 116, comparator 114B is triggered, and the logic circuitry 120 interrupts the charging by opening the switch 108B via the signal clk.

After the charging of the oscillation capacitor 102A has been interrupted by opening the switch 108A via clkb, the voltage VcapA at node 108A can be coupled to the overshoot error integrator circuit 122, which can include integrating operational amplifier circuit 124 and integration capacitor $C_{int}$ 126. This can include closing the switch 128A to establish a connection between VcapA at node 108A and an inverting input of the integrating operational amplifier circuit 124. This can include the logic circuitry 120 providing a control signal TxA that is non-overlapping with respect to the control signal clkb, so that the error integrator 124 does not begin integrating the overshoot error until after the charging of the oscillation capacitor 102A has been interrupted.

Similarly, after the charging of the oscillation capacitor 102B has been interrupted by opening the switch 108B via clk, the voltage VcapB at node 108B can be coupled to the overshoot error integrator circuit 122, which can include error integrating operational amplifier circuit 124 and integration capacitor $C_{int}$ 126. This can include closing the switch 128B to establish a connection between VcapB at node 108B and an inverting input of the integrating operational amplifier circuit 124. This can include the logic circuitry 120 providing a control signal TxB that is non-overlapping with respect to the control signal clk, so that the error integrator 124 does not begin integrating the overshoot error until after the charging of the oscillation capacitor 102B has been interrupted.

The signals TxA and TxB can be non-overlapping, such that only one of nodes 108A-B is connected to the inverting input of the integrating operational amplifier circuit 124 at any particular time when alternating closing of the switches 128A-B. During an error integration phase, which can also be referred to as a charge transfer phase, the error integrator circuit 122 can integrate the respective overshoot error on each of the alternatingly charged oscillation capacitors, after their charging has been interrupted, onto the integration capacitor 126. The resulting output signal of the error integrator circuit 122, at node 116, can establish the target voltage of the comparators 114A-B as $V_{target}=(V_{ref}-\text{Overshoot})$, where $V_{ref}$ is the voltage at node 110, which can be fed to the non-inverting input of the error integrating operational amplifier circuit 124.

After the error integration phase during TxA of the overshoot error at node 118A of the oscillation capacitor 102A is complete, then the switch 108A is opened before resetting the voltage on the oscillator capacitor 102A by closing the switch 130A using the reset control signal RstA, which can be made non-overlapping with the control signal TxA so that this error integration phase is complete before the oscillator capacitor voltage is reset.

Similarly, after the error integration phase during TxB of the overshoot error at node 118B of the oscillation capacitor 102B is complete, then the switch 108B is opened before resetting the voltage on the oscillator capacitor 102B by closing the switch 130B using the reset control signal RstB, which can be made non-overlapping with the control signal TxB so that this error integration phase is complete before the oscillator capacitor voltage is reset.

To recap, the error integrator circuit 122 changes the target voltage $V_{target}$ at node 116 that the comparators 114A-B compare and fire against, by integrating the charge on the oscillation capacitors 102A-B after completion of their respective charging phases and before beginning their respective reset phases. The target voltage $V_{target}$ at node 116 stabilizes (e.g., over multiple charging cycles) when the oscillation capacitors 102A-B are being charged to the desired reference voltage $V_{ref}$ at node 110 during their respective charging phases. The error integrator circuit 122 outputs and adjusts the target voltage $V_{target}$ at node 116 to move the trigger point of the comparators 114A-B to make the respective voltages at nodes 118A-B to which the oscillation capacitors 102A-B charge to be equal to the reference voltage, at node 110, of the error integrator circuit 112.

A potential benefit of including the error integrator 122 is that it compensates for and decreases the effect of offset in the comparators 114A-B and delay in the comparators 114A-B or in the logic circuitry 120, or both, such that the oscillator output clock frequency of the oscillator circuit 100 can be nearly fully determined by the oscillation resistor 104 and the oscillation capacitors 102A-B. The offset contribution of the comparators 114A-B can be averaged, so that it merely results in an error in a duty cycle, and not in an error in the frequency, of the oscillator output clock frequency. Including the error integrator 122 also allows a slower comparator 114A-B to be used to achieve similar results, which can, in turn, lye traded off for one or more other benefits, such as reduced power consumption.

Although an offset of the integrating operational amplifier circuit 124 of the error integrator circuit 122 can introduce an error into the system, the error integrator loop can operate at a lower bandwidth, e.g., over multiple clock cycles of the oscillator circuit 100, so that such offset of the integrating operational amplifier circuit 124 can be more easily accommodated than an offset in either of the comparator circuits 114A-B. For example, the effect of offset of the integrating operational amplifier circuit 124 can be reduced or minimized by using one or more of larger FETs in the operational amplifier circuit 124, offset trim (e.g., by programmably selectable FETs in the operational amplifier circuit 124), or auto-zeroing or chopping the operational amplifier circuit 124, since it is a lower speed circuit than the comparators 114A-B.

Also, in the example shown in FIG. 1, because the oscillation current source 106A is shared and alternated between charging the oscillation capacitor 102A and the oscillation capacitor 102B, less power is consumed and there is less impact of matching current sources as compared to an implementation using separate current sources for charging the oscillation capacitors 102A-B, although that is also a possible option that can be used. Also, because the oscillation current is diverted from one oscillation capacitor 102A to the other oscillation capacitor 102B, during a reset phase of the oscillation capacitor 102A, rather than being directed through the reset switch 130A, the effect of a voltage drop across the "on" resistance of the reset switch 130A can advantageously be reduced or minimized. This can also advantageously allow isolation of the capacitance of the current source 106A and the parasitic capacitance of the accompanying routing lines on the other side of the switch 108A to be isolated from the capacitance of the oscillation capacitor 102A when the switch 108A is open, thereby reducing or minimizing the impact of such capacitances on the oscillation frequency, which is desired to be determined using the capacitance of the oscillation capacitor 102A together with the resistance value of the oscillation resistor 104. Of course, similar advantages can be obtained during resetting of the oscillation capacitor 102B.

In an example, at least one of the integration phase and the reset phase can be controlled using respective control signals (e.g., TxA, TxB, RstA, RstB) that can be generated by at least one of a monostable or one-shot circuit, or a locked delay circuit. However, this can be process-sensitive and may involve trimming or calibration at manufacture or upon initialization. In another approach, a comparator circuit using a divided-down $V_{ref}$ as a reference voltage for comparison to the charging voltage VcapA at node 118A and VcapB at node 118B can be used to generate at least some of the respective control signals (e.g., TxA, TxB, RstA, RstB), such as described elsewhere in this document.

Figure 2:
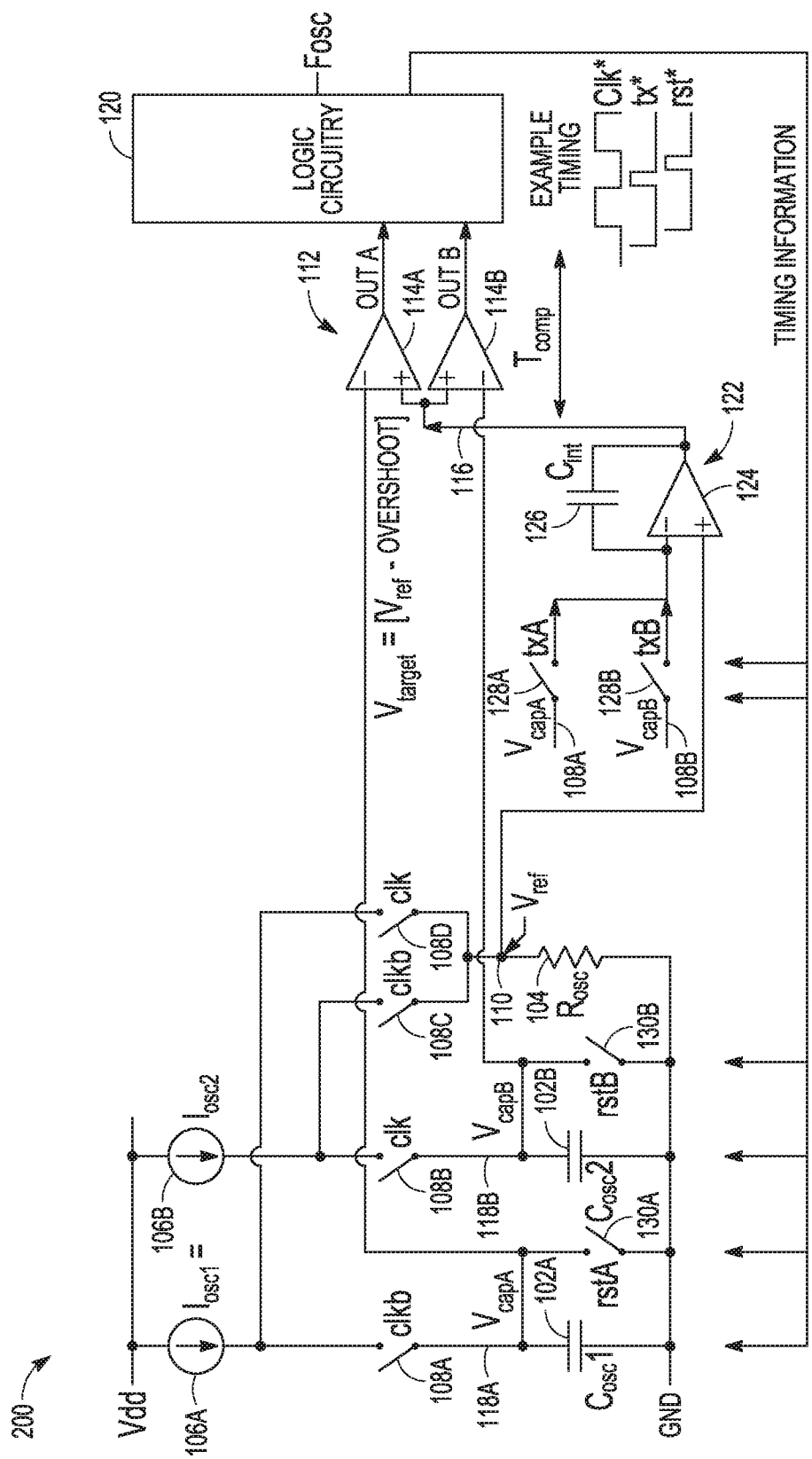
FIG. 2 shows an example of an overshoot error integrating sawtooth relaxation oscillator circuit in which current sources can be used alternatingly for charging an oscillation capacitor, then for biasing a resistor for generating a reference voltage, such as to reduce a current mismatch error component.

FIG. 2 shows an example of an overshoot error integrating sawtooth relaxation oscillator circuit 200, which is similar in to that of sawtooth relaxation oscillator circuit 100. In the sawtooth relaxation oscillator circuit 200, however, the current source $I_{osc1}$ 106A can be toggled between charging the first oscillation capacitor 102A, during its charging phase when the control signal clkb is asserted, and providing a bias current to the oscillation resistor $R_{osc}$ 104 to generate the reference voltage $V_{ref}$ at node 110 when the control signal clkb is not asserted and its complementary control signal clk is asserted. Similarly, in the RC sawtooth relaxation oscillator circuit 200, the current source $I_{osc2}$ 106B can be toggled between charging the second oscillation capacitor 102B, during its charging phase when the control signal clk is asserted, and providing a bias current to the oscillation resistor Rosc 104 to generate the reference voltage $V_{ref}$ at node 110 when the control signal clk is not asserted and its complementary control signal clkb is asserted.

In the approach shown in FIG. 2, the reference voltage $V_{ref}$ at node 110 can be based on the average of the currents provided by the oscillation current source $I_{osc1}$ 106A and that provided by the oscillation current source $I_{osc2}$ 106B, thereby reducing or cancelling, e.g., to a first-order, an error component due to the mismatch of the currents provided by these oscillation current sources $I_{osc1}$, $I_{osc2}$ 106A-B.

Figure 3:
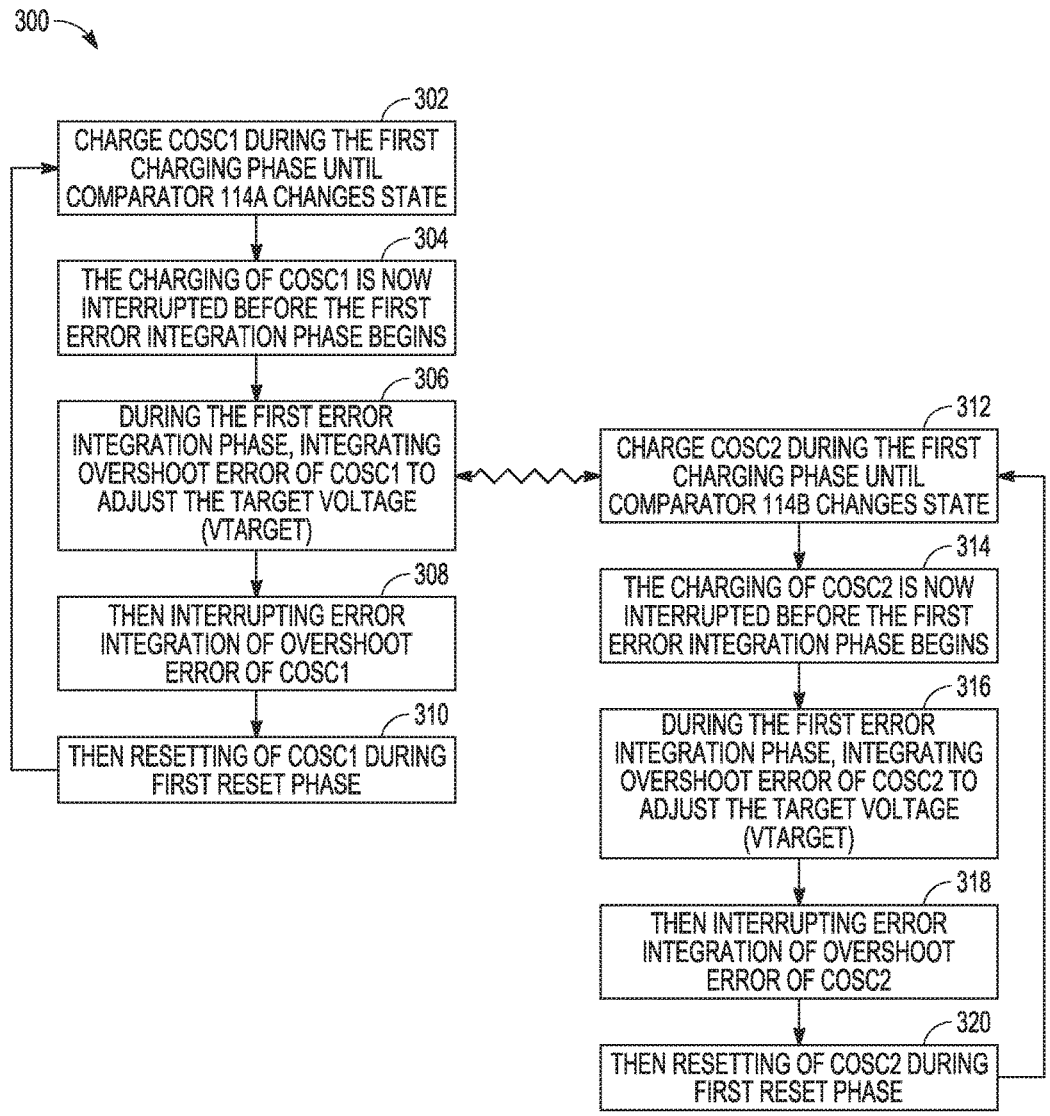
FIG. 3 shows an example of portions of a method of using an oscillator circuit such as that shown in FIGS. 1-2.

FIG. 3 shows an example of portions of a method 300 of using an oscillator circuit such as that shown in FIGS. 1-2. At 302, a first oscillation capacitor 102A can be charged during a first charging phase, such as when the control signal clkb is asserted, until a voltage on the first oscillation capacitor 102A meets a target voltage, such as at node 116 triggering comparator 104A. Then, at 304, when the target voltage has been met, the first charging phase is interrupted, thereby interrupting charging of the first oscillation capacitor 102A, before beginning a first error integration phase. At 306, the first error integration phase can be commenced by asserting the control signal TxA to close the switch 128A, such as to permit the overshoot error on the first oscillation capacitor 102A to be accumulated onto the integration capacitor 126, such as to adjust the target voltage at node 116 provided to the comparators 114A-B. Then, at 308, the first error integration phase can be interrupted, such as by de-asserting the control signal TxA and opening the switch 128A. Then, at 310, the first reset phase can begin, such as by asserting the control signal RstA to close the switch 130A to discharge the first oscillation capacitor 102A. Then, after completing the first reset phase, the switch 130A can be opened, and process flow can return to 302, to repeat the first charging phase by asserting the control signal clkb and closing the switch 108A.

Similarly, at 312 (which can be at least partially concurrent with 306), a second oscillation capacitor 102B can be charged during a second charging phase, such as when the control signal clk is asserted, until a voltage on the second oscillation capacitor 102B meets a target voltage, such as at node 116 triggering comparator 104B. Then, at 314, when the target voltage has been met, the first charging phase is interrupted, thereby interrupting charging of the second oscillation capacitor 102B, before beginning a second error integration phase. At 316, the second error integration phase can be commenced by asserting the control signal TxB to close the switch 128B, such as to permit the overshoot error on the second oscillation capacitor 102B to be accumulated onto the integration capacitor 126, such as to adjust the target voltage at node 116 provided to the comparators 114A-B. Then, at 318, the second error integration phase can be interrupted, such as by de-asserting the control signal tx and opening the switch 128B. Then, at 310, the second reset phase can begin, such as by asserting the control signal RstB to close the switch 130B to discharge the second oscillation capacitor 102B. Then, after completing the second reset phase, the switch 130B can be opened, and process flow can return to 312, to repeat the second charging phase by asserting the control signal clk and closing the switch 108B.

As shown in the example of FIG. 1, the first charging phase and the second charging phase are performed alternatingly by using and switching the same first current source or sink 106A to charge both the first and second oscillation capacitors 102A-B.

As shown in the example of FIG. 2, the first charging phase and the second charging phase can be performed alternatingly by using different first and second current sources/sinks 106A-B that can also be used to generate the reference voltage $V_{ref}$ such as by providing a bias current through an oscillation resistor when not charging the first and second oscillation capacitors.

Further, the oscillation frequency of the clock signal can be adjusted, such as by at least one (or any combination) of: (1) adjusting a charging current of the first and second oscillation capacitors 102A-B, such as by using one or more programmable current source or sinks; (2) adjusting a resistance used to generate the reference voltage, such as by laser-trimming during manufacturing or by programming using a non-volatile memory to select the resistance value; or (3) adjusting a capacitance of the first and second oscillation capacitors, such as by using a capacitor array that is selectively programmable to provide the desired capacitance value.

In an example, the first and second oscillation capacitors 102A-B can each include composite capacitors that can include or consist of capacitors or sub-capacitors having different temperature coefficients, such as with temperature coefficients that can offset each other to provide a composite capacitor having a more temperature stable capacitance value, or a more temperature stable resistance·capacitance product (e.g., Rosc·Cosc, time-constant). For example, a metal-oxide-metal (MOM) sub-capacitor having a positive temperature coefficient can be used in combination with a metal-insulator-metal (MIM) capacitor having a negative temperature coefficient to provide a temperature stable composite capacitor that can be used as one or both of the first and second oscillation capacitors 102A-B. In another example, different capacitor temperature coefficients can be used to offset a temperature coefficient of the oscillation resistor, Rosc 104, such as to provide a more temperature stable resistance·capacitance product. In such a case, the oscillation frequency may not vary with temperature, but the oscillation duty cycle may be affected by the ambient or operating temperature of the oscillator circuit.

In an example, the first and second oscillation capacitors 102A-B can be charged, or the oscillation resistor Rose 104 can be biased, or both, using a current source (or discharged using a current sink) comprising a selected combination of a temperature stable current and a proportional-to-absolute temperature current. This can be used to effect a change in oscillation frequency with temperature, if desired. In an example, each of the current sources 106A-B can include a combination of parallel current source elements, some of which are temperature stable (e.g., from being generated from a temperature-stable bandgap reference voltage) and others of which are temperature dependent (e.g., from being generated by a proportional-to-absolute-temperature (PTAT) current generator circuit).

The overshoot error integrating circuit 122 can optionally have its offset error component reduced by at least one of: (1) trimming the integrator circuit, such as by programming in a selected number of input FEES or other devices to compensate for an offset error in a differential pair input stage of the amplifier 124; (2) auto-zeroing the integrator circuit, such as by including an autozeroing switch and including an autozeroing phase before one or both of the first and second error integration phases; or (3) chopping a signal of the integrator circuit 124. One or more of a variety of different autozeroing techniques can be used, for example, providing an offset storage capacitor within the amplifier 124, storing an offset of the amplifier 124 on a capacitor on the inverting terminal of the amplifier 124, such as by opening a switch to the integration capacitor Cint 124 and closing an autozeroing switch, or using a time-interleaved "ping-ponging" of multiple individual amplifiers 124 for the different phase TxA and TxB such that one amplifier can be auto-zeroed while the other amplifier is being used for integration of the signal onto the integration capacitor Cint.

In an example, at least one of the integration phase and the reset phase can be controlled using respective control signals (e.g., TxA, TxB, RstA, RstB) that can be generated by at least one of a monostable or one-shot circuit, or a locked delay circuit, such as a delay circuit that is locked to the oscillation period. For example, an overshoot integration signal TxA can be asserted while the second oscillation capacitor 102B is charging, until such charging reaches a desired trip point (e.g., half-completion of the charging of the second oscillation capacitor toward the reference voltage, $V_{ref}$, such as can be detected by a comparator circuit using a divided-down $V_{ref}$ as a reference voltage for comparison to the charging voltage at node 118B). In response to the specified trip point having been achieved, the overshoot integration signal TxA can be de-asserted, thereby achieving a desired locked delay that can provide and ensure adequate time for overshoot error integration by the error integrator circuit 122.

To reduce the number of charging cycles that the overshoot error integrator circuit 122 needs to bring the overshoot into compliance, integrating the overshoot error includes using an integrator circuit including an integrator input and an integrator output, wherein the integrator circuit is precharged to a different voltage on the integrator output than the voltage on the integrator input. This can help to reduce a startup time of the oscillator during which overshoot is being brought into compliance. For example, a digital-to-analog converter (DAC) circuit can provide an analog output that can be switchably coupled across the integration capacitor 126 to establish its initial voltage based upon a programmed code specified at the input of the DAC circuit.

Figure 4:
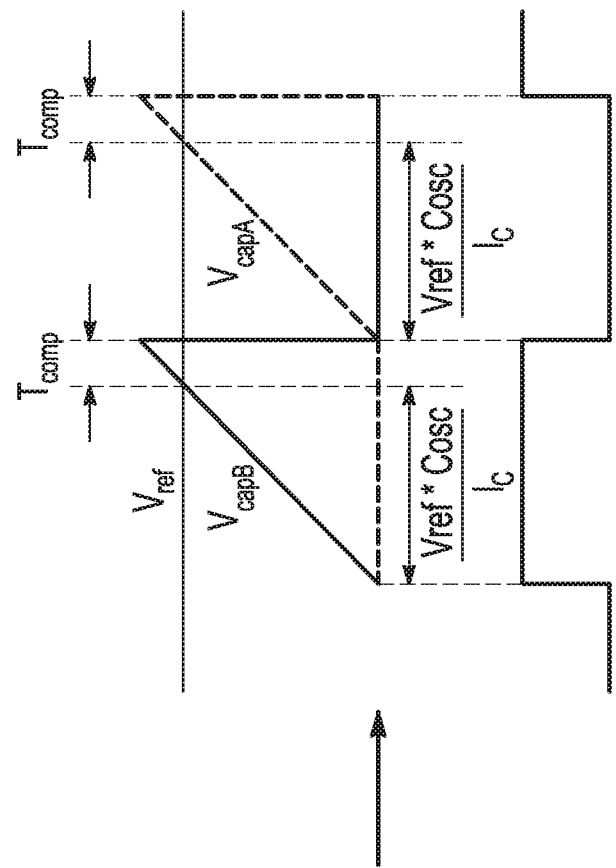
FIGS. 4-5 compares example of waveforms associated with a relaxation oscillator, without including overshoot error integration (FIG. 4) and with including overshoot integration (FIG. 5).
Figure 4:
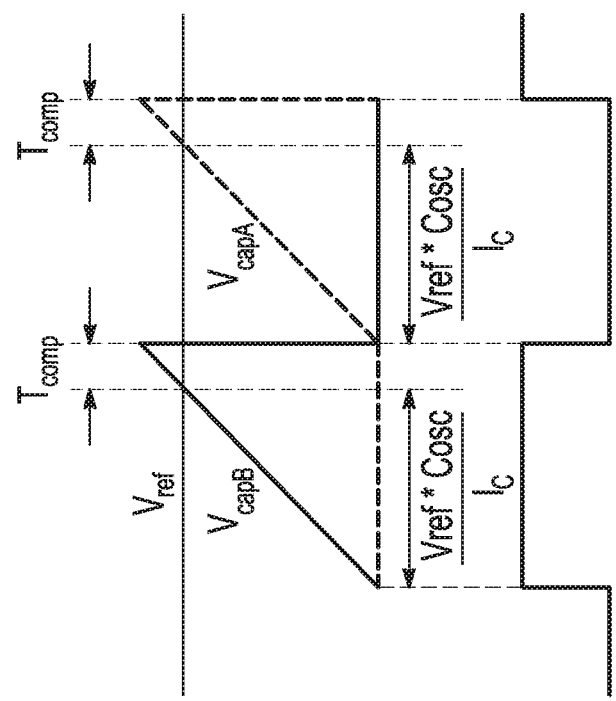
Figure 5:
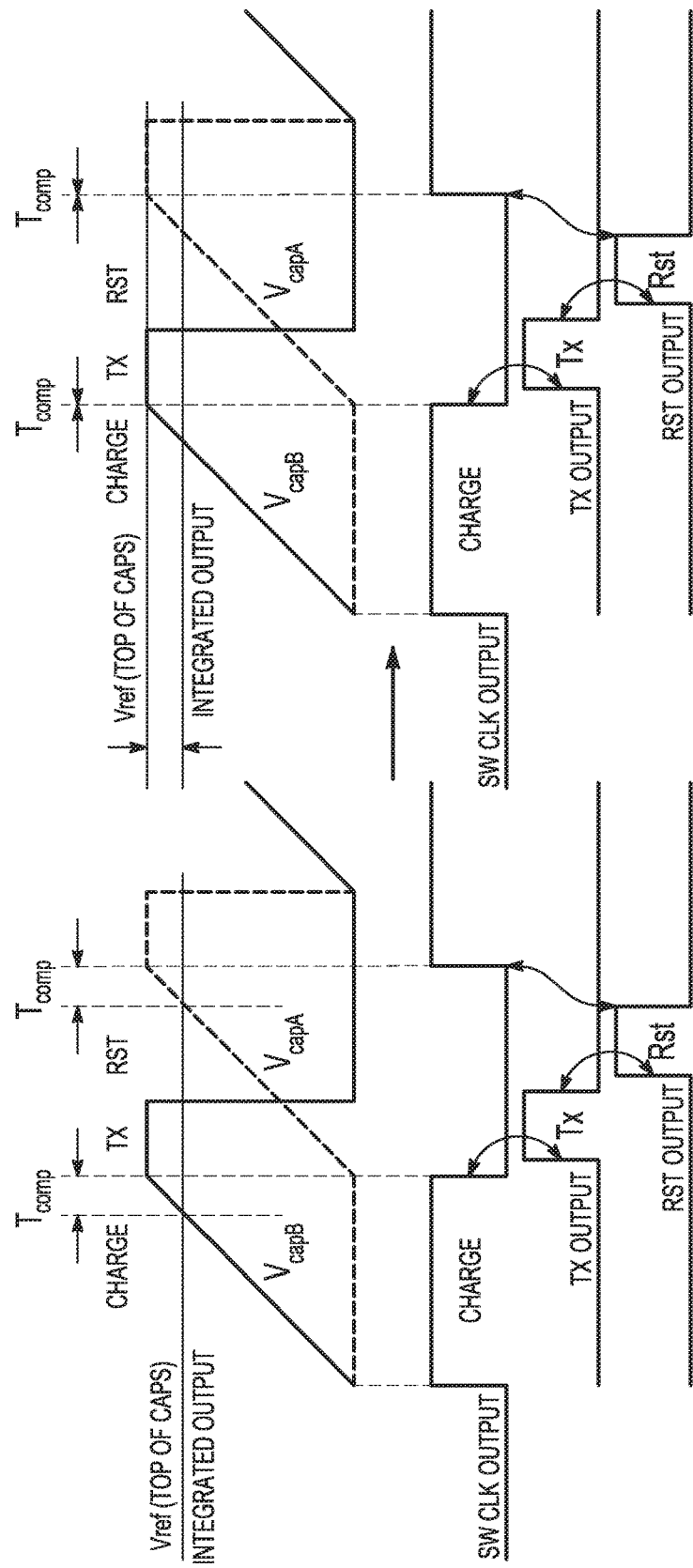

FIGS. 4-5 compares examples of waveforms associated with a relaxation oscillator, without including overshoot error integration (FIG. 4) such as without the error integrator 122 shown in FIGS. 1-2, and with including overshoot error integration (FIG. 5) such as with the error integrator 122 shown in FIGS. 1-2.

In FIG. 4, without including overshoot error integration, waveform VcapB shows the voltage at node 118A being charged by Iosc1 106A during clkb toward and overshooting the reference voltage Vref at node 110, and waveform VcapA shows the voltage at node 118b being charged by Iosc2 106B during clk toward and overshooting the reference voltage Vref at node 110. As seen in FIG. 4, there exists a time Tcomp for the comparators 114 to detect and react and for the delay through logic circuit 120 processing the output of the comparators 114, leading to overshoot.

In FIG. 5, which does include overshoot error integration, such as having the three distinct phases (e.g., charge phase, integration phase TX, and reset phase Rst), the integrator output voltage at node 116 will adjust and be different than the reference voltage Vref at node 110, such that the overshoot can be eliminated, decreased, or minimized, rendering the effect of the comparator time Tcomp negligible. The resulting waveforms are shown in FIG. 5.

In an optional variation, frequency-doubling (or higher-order frequency multiplication) can be provided. For example, a frequency doubler circuit can be coupled to the outputs of the comparator circuits 114A-B. The frequency doubler circuit can include an exclusive-OR logic circuit having inputs respectively coupled to the outputs of the comparator circuits, and having an output that provides a frequency-doubled clock signal.

Figure 6:
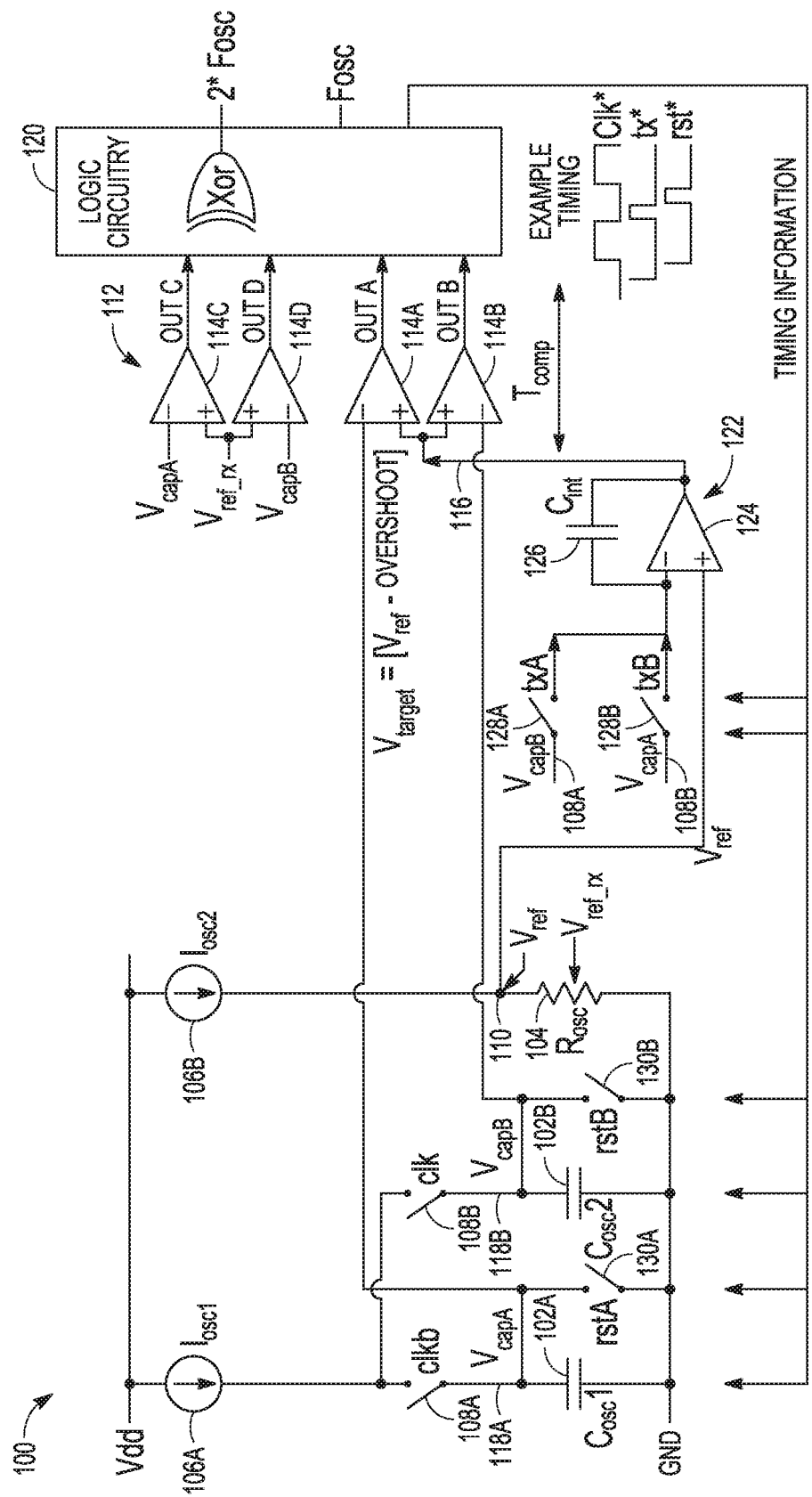
FIG. 6 shows an example of an overshoot error integrating sawtooth relaxation oscillator circuit, similar to FIG. 1, but including comparators and logic circuitry to generate control signals for at least one of the integration and reset phases, which can also provide frequency-doubling capability.

FIG. 6 shows an example of an overshoot error integrating sawtooth relaxation oscillator circuit, similar to FIG. 1, but including comparators and logic circuitry to generate control signals for at least one of the integration and reset phases, which can optionally also provide frequency multiplying capability, such as frequency-doubling. In an example, the reference voltage Vref at node 110 can be divided down, such as by implementing the oscillation resistor Rosc 104 using a resistor divider, a programmable resistor, or the like, to generate at least one secondary reference voltage Vref_rx, which can be less than and a function of (e.g., fractionally proportional to) Vref. The secondary reference voltage Vref_rx can be provided to non-inverting inputs of a pair of additional comparators 114C-D, for comparison against the voltage VcapA at node 118A and the voltage VcapB at node 118B to generate the comparator output signals outC and outD, respectively, which can be used to provide reset signals RstA and RstB, and to which a logic circuit function (e.g., an exclusive-OR function) can be applied by the logic circuitry 120 to generate an oscillation frequency 2·Fosc at double the primary oscillator frequency, Fosc. This allows frequency-multiplying generation of an additional higher frequency oscillating clock output by adding little extra circuit complexity (e.g., comparators and logic circuitry (e.g., XOR circuit)).

Figure 7:
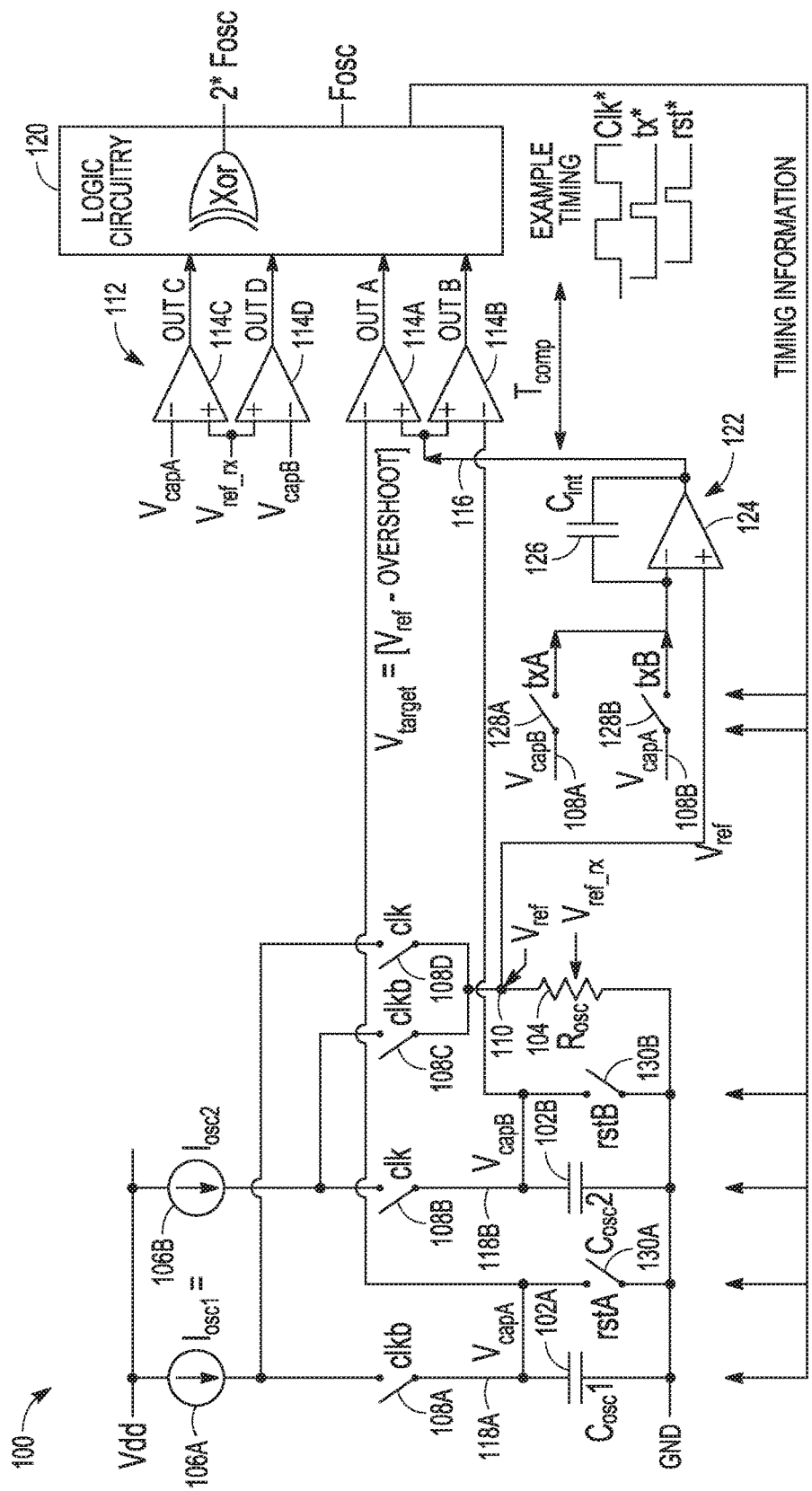
FIG. 7 shows an example of an overshoot error integrating sawtooth relaxation oscillator circuit, similar to FIG. 2, but including comparators and logic to generate control signals for at least one of the integration and reset phases, and which can also provide frequency-doubling capability, such as explained above, with respect to FIG. 6.

FIG. 7 shows an example of an overshoot error integrating sawtooth relaxation oscillator circuit, similar to FIG. 2, but including comparators and logic to generate control signals for at least one of the integration and reset phases, and which can also provide frequency-doubling capability, such as explained above, with respect to FIG. 6.

Figure 8:
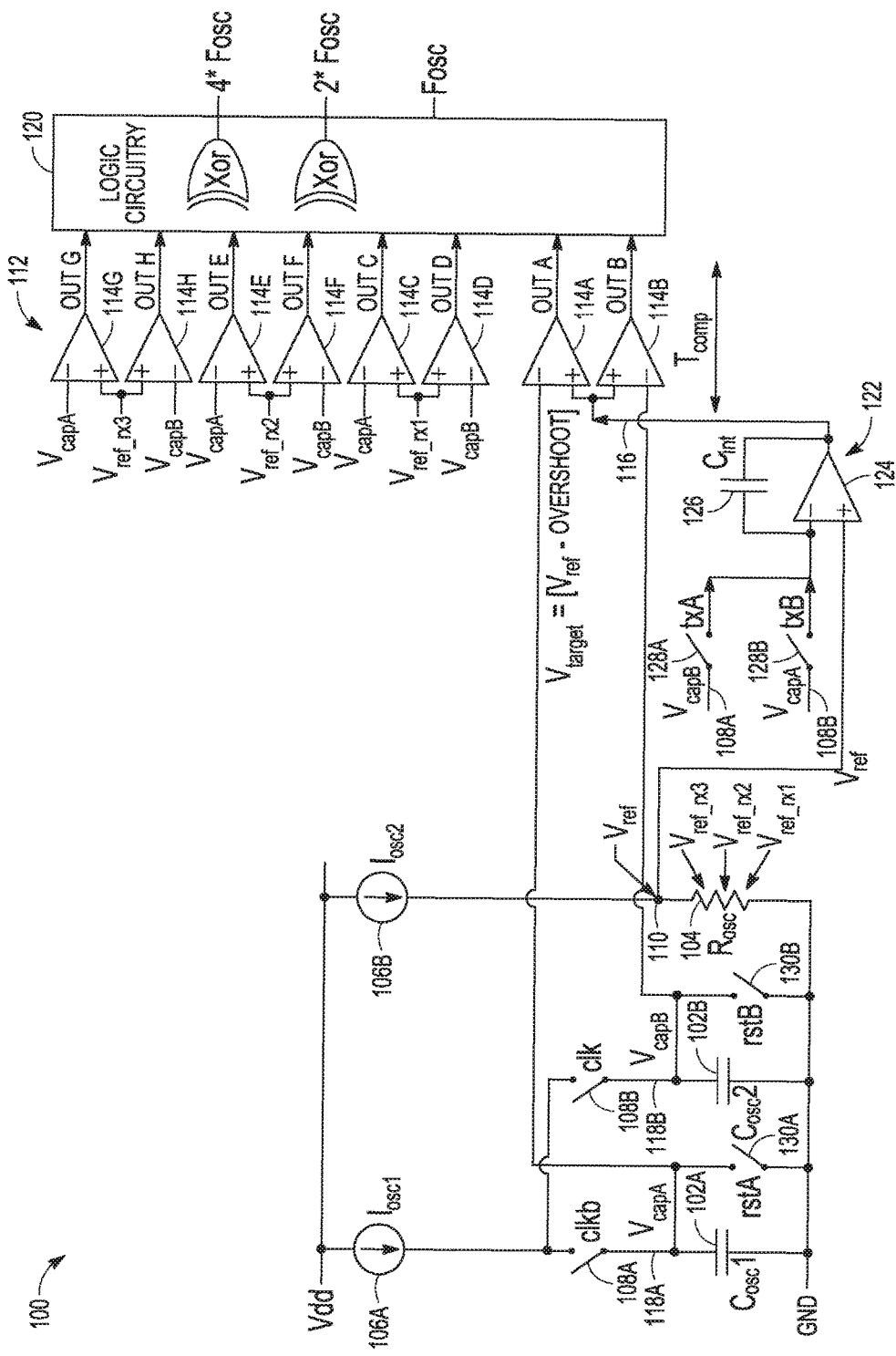
FIG. 8 shows an example of an overshoot error integrating sawtooth relaxation oscillator circuit, similar to FIG. 6, but including additional secondary reference voltages, additional comparators, and exclusive-OR (XOR) or logic circuitry, or both, such as for generation of one or more higher multiples of the oscillation frequency.

FIG. 8 shows an example of an overshoot error integrating sawtooth relaxation oscillator circuit, similar to FIG. 6, but including additional secondary reference voltages (e.g., Vref_rx1, Vref_rx2, Vref_rx3), additional comparators 114E-H, and logic circuitry 120 including additional logic circuitry (e.g., exclusive-OR (XOR) circuitry), such as for generation of one or more higher multiples of the oscillation frequency, such as 4·Fosc, as shown. The additional secondary reference voltages can be generated using a resistor divider network, a programmable resistor, or the like, such as explained above with respect to FIG. 6. The secondary reference voltages (e.g., Vref_rx1, Vref_rx2, Vref_rx3) can be less than and a function of (e.g., fractionally proportional to) Vref.

The secondary reference voltage Vref_rx can be provided to non-inverting inputs of a pair of additional comparators 114C-D, for comparison against the voltage VcapA at node 118A and the voltage VcapB at node 118B to generate the comparator output signals OUTA and OUTB, respectively, to which an exclusive-OR function can be applied by the logic circuitry 120 to generate an oscillation frequency 2·Fosc at double the primary oscillator frequency, Fosc.

The secondary reference voltage Vref_rx2 can be provided to non-inverting inputs of a pair of additional comparators 114E-F, for comparison against the voltage VcapA at node 118A and the voltage VcapB at node 118B to generate the comparator output signals OUTC and OUTD, respectively. The secondary reference voltage Vref_rx3 can be provided to non-inverting inputs of a pair of additional comparators 114G-H, for comparison against the voltage VcapA at node 118A and the voltage VcapB at node 118B to generate the comparator output signals OUTE and OUTF, respectively. An logic circuit function, such as an exclusive-OR function, can be applied to the comparator output signals OUTC, OUTD, OUTE, and OUTF to generate an oscillation frequency 4·Fosc at quadruple the primary oscillator frequency, Fosc.

Figure 9:
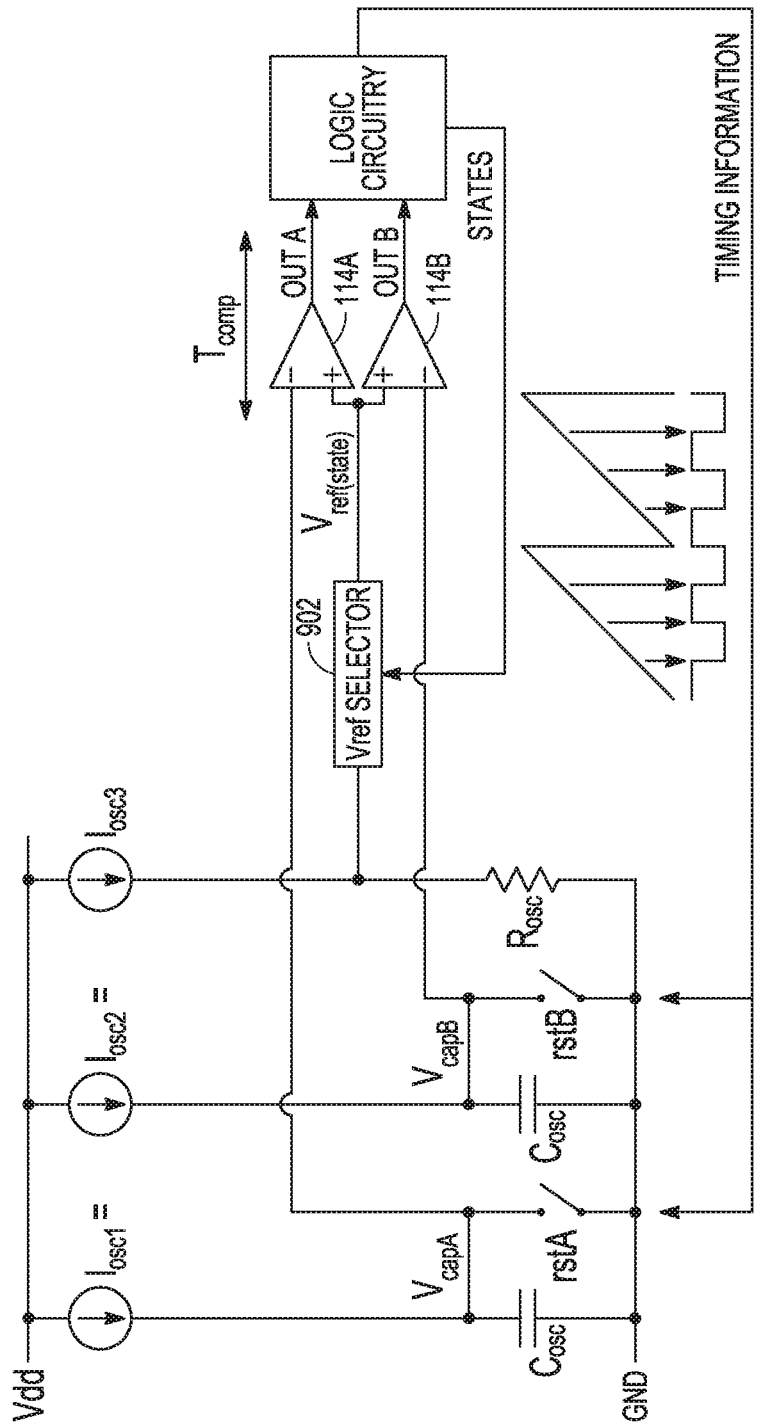
FIG. 9 shows an example of an overshoot error integrating sawtooth relaxation oscillator circuit, similar to FIG. 6, but capable of generating one or more additional higher order oscillation frequencies without requiring additional comparators.

FIG. 9 shows an example of an overshoot error integrating sawtooth relaxation oscillator circuit, similar to FIG. 6, but capable of generating one or more additional higher order oscillation frequencies without requiring additional comparators beyond the comparators 114A-B. In this example, a programmable, variable, or otherwise multi-valued secondary reference voltage can be multiplexed onto the non-inverting inputs of the comparators 114A-B, such as via the Vref selector circuit 902 or another suitable analog multiplexor circuit. The multi-valued secondary reference voltage can be generated such as explained above with respect to FIG. 8, e.g., using a resistor divider, a programmable resistor, or the like. The multiple values of the multi-valued secondary reference voltages (e.g., Vref_rx1, Vref_rx2, Vref_rx3) can be less than and a function of (e.g., fractionally proportional to) Vref. By selecting appropriate values of the secondary reference voltage for being compared against the sawtooth oscillation capacitor waveforms VcapA and VcapB, additional clock edges can be generated at additional times that can be specified at appropriate fractional values of Vref for the comparators 114A-B to generate the higher order oscillation frequencies, e.g., 2·Fosc, 4·Fosc, etc., while the reference voltage Vref can be provided to the comparators 114A-B to generate the fundamental oscillation frequency Fosc.

Figure 10:
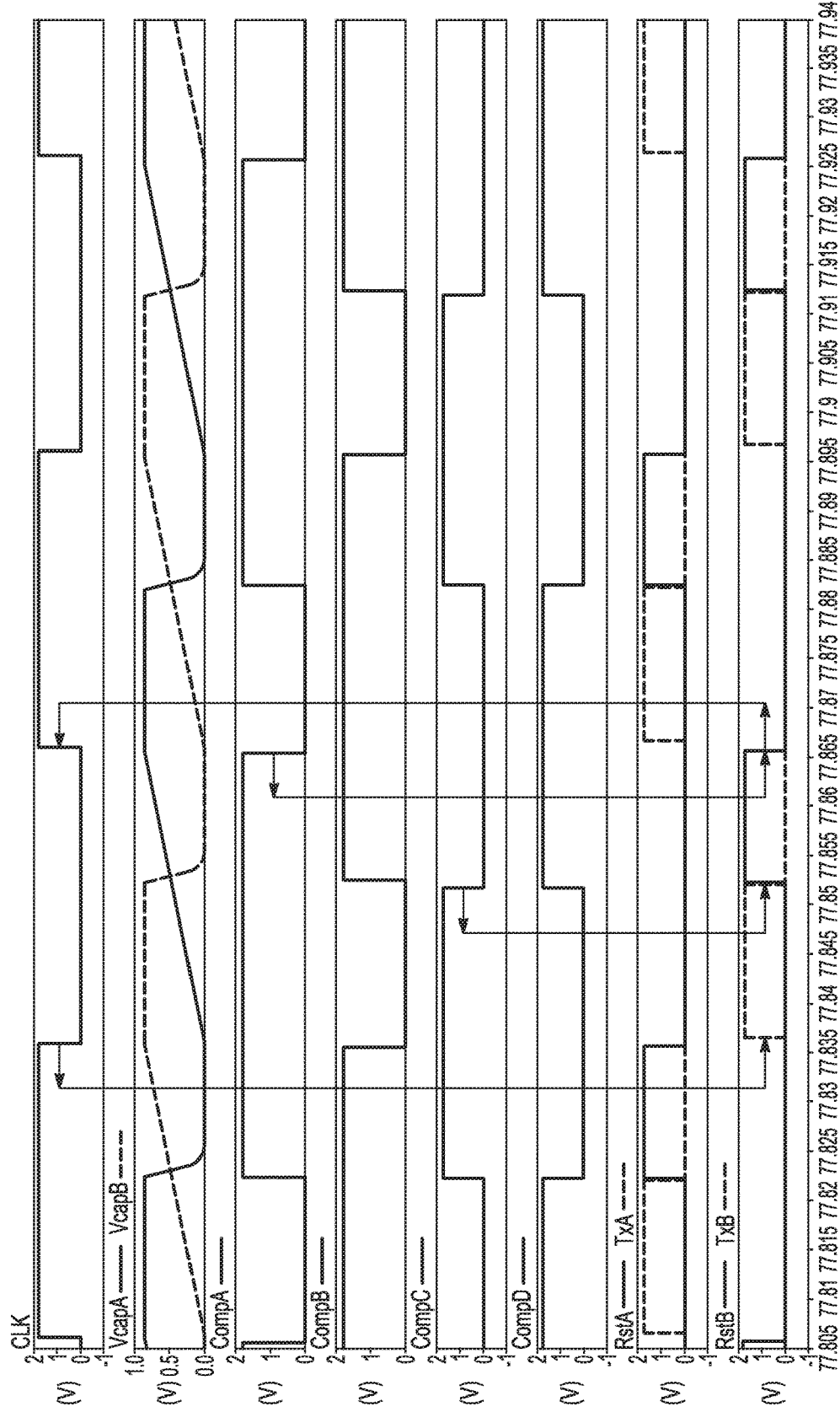
FIG. 10 is a computer simulation transient analysis timing diagram.

FIG. 10 is a computer simulation transient analysis timing diagram. In FIG. 10, the top trace (1) shows a clock signal CLK, for running the switches 108A, 108B for generating the sawtooth oscillation capacitor waveforms VcapA at node 118A and VcapB at node 118B. The switch 108A can be closed when CLK is asserted, the switch 108B can be closed when CLK is de-asserted (e.g., shown by a clock signal CLKB, which can be the non-overlapping inverse of CLK). The second and third traces (2, 3) show the respective sawtooth oscillation capacitor waveforms VcapA at node 118A and VcapB at node 118B, which can be generated by one or more respective current sources 106 charging respective oscillation capacitors 102A-B, such as explained above. The fourth trace (4) shows a signal CompA, which is the voltage at the output of comparator 114A. The fifth trace (5) shows a signal CompB, which is the voltage at the output of comparator 114B. The sixth trace (6) shows a signal CompC, which is the voltage at the output of comparator 114C. The seventh trace (7) shows a signal CompD, which is the voltage at the output of Comparator 114D. The eighth and ninth traces (8, 9) show a reset clock signal, RstA, and an integration clock signal, TxA, such as for providing reset and integration phases for the current-source-charged oscillation capacitor 102A. The tenth and eleventh traces (10, 11) show a reset clock signal, RstB, and an integration clock signal, TxB, such as for providing reset and integration phases for the current-source-charged oscillation capacitor 102B.

As seen in FIG. 10, the falling edge of the clock signal CLK triggers the rising edge of the integration clock signal, TxB, and the corresponding integration phase referred to in FIG. 5. Then, the falling edge of the output of the comparator 1140 (CompC) triggers generation of the TxB falling edge, which, in turn, triggers generation of the RstB rising edge. Then, the falling edge of the output of the comparator 114A (CompA) triggers generation of the RstB falling edge, which, in turn, triggers generation of the CLK rising edge. In this manner, distinct, non-overlapping integration TxB and reset RstB periods can be provided.

Similarly, the rising edge of the clock signal CLK triggers the rising edge of the integration clock signal, TxA, and the corresponding integration phase referred to in FIG. 5. Then, the falling edge of the output of the comparator 1141) (CompD) triggers generation of the TxA falling edge, which, in turn, triggers generation of the RstA rising edge. Then, the falling edge of the output of the comparator 114B (CompB) triggers generation of the RstA falling edge, which, in turn, triggers generation of the CLK falling edge. In this manner, distinct, non-overlapping integration TxA and reset RstA periods can be provided.

To recapitulate, FIG. 10 shows waveforms for a sawtooth relaxation oscillator example having distinct alternating charging, integration (TxA, TxB), and reset (RstA, RstB) phases, such as described above with respect to FIG. 5. The timing for the TxA, TxB and RstA, RstB pulses can be implemented via a cascade of like SR latches. One edge can trigger the generation of the next. Overlap can be avoided, without any inherent race conditions due to relative edges. This is a much more robust approach than an approach generating a clock at a frequency higher than the oscillation frequency using a mono-stable circuit, which will scale with process, and will require trimming, such as to adjust for a temperature coefficient.

VARIOUS NOTES

Although the above description has focused on some examples in which the oscillation capacitors are referenced to a negative power supply voltage node or ground node and charged via current sources from a positive power supply voltage, the architecture shown can be inverted to include oscillation capacitors referenced to the positive power supply and current sinks that discharge the oscillation capacitors to the negative power supply or ground node.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination The claimed invention is:

1. A method of using a relaxation oscillator to generate a clock signal, the method comprising:
   charging a first oscillation capacitor with a current from a first current source or sink during a first charging phase, until a first comparator determines that a first oscillation capacitor voltage meets a target voltage;
   in response to the first oscillator capacitor voltage meeting the target voltage, interrupting charging of the first oscillation capacitor before a first error integration phase commences;
   during the first error integration phase, adjusting the target voltage by integrating an overshoot error of a voltage on the first oscillation capacitor beyond a reference voltage, the reference voltage generated by passing a current from the first current source or sink, or a replicate thereof through an oscillation resistor to generate the reference voltage, after the charging of the first oscillation capacitor has been interrupted;
   after the first error integration phase, interrupting integration of the overshoot error of the voltage on the first oscillation capacitor before a first reset phase commences; and
   during the first reset phase, discharging the first oscillation capacitor.

2. The method of claim 1, further comprising:
   charging a second oscillation capacitor with a current during a second charging phase, until a separate second comparator determines that a second oscillation capacitor voltage meets the target voltage;
   in response to the second oscillator capacitor voltage meeting the target voltage, interrupting charging of the second oscillation capacitor before a second error integration phase commences;
   during the second error integration phase, adjusting the target voltage by integrating an overshoot error of a voltage on the second oscillation capacitor beyond the reference voltage after the charging of the second oscillation capacitor has been interrupted;
   after the second error integration phase, interrupting integration of the overshoot error of the voltage on the second oscillation capacitor before a second reset phase commences;
   during the second reset phase, discharging the second oscillation capacitor.

3. The method of claim 2, wherein the first charging phase and the second charging phase are performed alternatingly by using and switching the same first current source or sink to charge both the first and second oscillation capacitors.

4. The method of claim 2, wherein the first charging phase and the second charging phase are performed alternatingly by using different first and second current sources/sinks that are also used to generate the reference voltage through an oscillation resistor when not charging the first and second oscillation capacitors.

5. The method of claim 2, comprising trimming an oscillation frequency of the clock signal by at least one of:
   (1) adjusting the charging current of either or both of the first and second oscillation capacitor;
   (2) adjusting a resistance used to generate the reference voltage; or
   (3) adjusting a capacitance of at least one of the first and second oscillation capacitors.

6. The method of claim 2, comprising using first and second oscillation capacitors comprising capacitors or sub-capacitors having different capacitor types or temperature coefficients.

7. The method of claim 2, comprising charging the first and second oscillation capacitors or creating the reference voltage signal using a current source or sink comprising a selected combination of a temperature stable current and a proportional-to-absolute temperature current.

8. The method of claim 2, wherein integrating the overshoot error includes using an integrator circuit having an offset reduced by at least one of: (1) trimming the integrator circuit; (2) auto-zeroing the integrator circuit; or (3) chopping a signal of the integrator circuit.

9. The method of claim 2, wherein at least one of the integration phase and the reset phase are controlled using respective control signals generated by respective comparators comparing respective voltages on the first and second oscillation capacitors to a secondary reference voltage that is a fraction of and less than a primary reference voltage that is used to generate the target voltage.

10. The method of claim 2, wherein integrating the overshoot error includes using an integrator circuit including an integrator input and an integrator output, wherein the integrator circuit is precharged to a different voltage on the integrator output than the voltage on the integrator input to reduce a startup time of the oscillator during which overshoot is being brought into compliance.

11. A relaxation oscillator circuit to generate a clock signal, the relaxation oscillator circuit comprising:
   a first oscillation capacitor;
   a first current source or sink, to charge the first oscillation capacitor during a first charging phase, until a first comparator determines that a first oscillation capacitor voltage meets a target voltage;
   a first switch to interrupt charging of the first oscillation capacitor in response to the first oscillator capacitor voltage meeting the target voltage, before a first error integration phase commences;
   an overshoot error integration circuit to adjust the target voltage by integrating an overshoot error of the first oscillation capacitor voltage beyond a reference voltage, generated by passing a current from a current source circuit through a resistor, after the charging of the first oscillation capacitor has been interrupted;
   a second switch to interrupt integration of the overshoot error of the first oscillation capacitor voltage to complete the first error integration phase before a first reset phase commences;

a third switch, to discharge the first oscillation capacitor during the first reset phase after the first error integration phase has been completed and before repeating a first charging phase; and an oscillation resistor biased by the first current source or sink, or a replicate thereof, to generate the reference voltage.

12. The oscillator circuit of claim 11, further comprising:
a second oscillation capacitor;
the first current source or sink, or a separate second current source or sink, to charge the second oscillation capacitor during a second charging phase, until a separate second comparator circuit determines that second oscillation capacitor voltage meets the target voltage;
a third switch to interrupt charging of the second oscillation capacitor in response to the second oscillator capacitor voltage meeting the target voltage; before a second error integration phase commences;
the overshoot error integration circuit arranged to adjust the target voltage by integrating an overshoot error of the second oscillation capacitor voltage beyond a reference voltage after the charging of the second oscillation capacitor has been interrupted;
a fourth switch to interrupt integration of the overshoot error of the second oscillation capacitor voltage to complete the second error integration phase before a second reset phase commences; and
a fifth switch, to discharge the second oscillation capacitor during the second reset phase after the second error integration phase has been completed and before repeating a second charging phase.

13. The oscillator circuit of claim 12, wherein the first charging phase and the second charging phase are performed alternatingly by using and switching the same first current source or sink to charge both the first and second oscillation capacitors.

14. The oscillator circuit of claim 12, including an oscillation resistor and different first and second current sources/sinks and switches to alternatingly charge one of the first and second oscillation capacitors and then provide a bias current through the oscillation resistor to generate the reference voltage when not charging the one of the first and second oscillation capacitors.

15. The oscillator circuit of claim 12, comprising an oscillation frequency of the clock signal trimmed by at least one of:
(1) adjusting the charging current of either or both of the first and second oscillation capacitor;
(2) adjusting a resistance used to generate the reference voltage; or
(3) adjusting a capacitance of at least one of the first and second oscillation capacitors.

16. The oscillator circuit of claim 12, comprising using first and second oscillation capacitors comprising sub-capacitors having different temperature coefficients.

17. The oscillator circuit of claim 12, wherein at least one of the first and second current sources/sinks or a current source/sink used to create the reference voltage comprises a selected combination of a temperature stable current source or sink and a proportional-to-absolute temperature current source or sink.

18. The oscillator circuit of claim 12, including a locked delay circuit comprising a comparator to terminate at least one of the first and second error integration phases upon charging of an oscillation capacitor to a desired trip point.

19. The oscillator circuit of claim 12, including comparators to control at least one of the integration phase and the reset phase by comparing respective voltages on the first and second oscillation capacitors to a secondary reference voltage that is a fraction of and less than a primary reference voltage that is used to generate the target voltage.

20. The oscillator circuit of claim 12, wherein the overshoot error integrator circuit includes an integrator input and an integrator output and is precharged to a different voltage on the integrator output than the voltage on the integrator input to reduce a startup time of the oscillator during which overshoot is being brought into compliance.

21. The oscillator circuit of claim 12, including a frequency-multiplier circuit including logic circuit having inputs coupled to respective outputs of the first and second comparators, and having an output that provides a frequency-multiplied clock signal.

22. The oscillator circuit of claim 11, including an analog multiplexor circuit configured to connect a selected one of multiple reference voltages to at least one of the overshoot error integration circuit or a comparator input.

23. A method of using a relaxation oscillator to generate a clock signal, the method comprising:
charging a first oscillation capacitor with a current from a stable first current source or sink during a first charging phase, until a first comparator determines that a first oscillation capacitor voltage meets a target voltage;
in response to the first oscillator capacitor voltage meeting the target voltage, interrupting charging of the first oscillation capacitor before a first error integration phase commences;
generating a reference voltage by biasing an oscillation resistor using the first current source or sink or a replicate thereof;
during the first error integration phase, adjusting the target voltage by integrating an overshoot error of a voltage on the first oscillation capacitor beyond the reference voltage, after the charging of the first oscillation capacitor has been interrupted;
after the first error integration phase, interrupting integration of the overshoot error of the voltage on the first oscillation capacitor before a first reset phase commences; and
during the first reset phase, discharging the first oscillation capacitor.

24. The method of claim 23, comprising generating the reference voltage by biasing an oscillation resistor by the first current source or sink, or a replicate thereof, during an alternating phase from when the first current source is charging the first oscillation capacitor via a switch.

* * * * *